United States Patent
Shiraiwa et al.

(10) Patent No.: US 7,052,961 B1
(45) Date of Patent: May 30, 2006

(54) METHOD FOR FORMING WORDLINES HAVING IRREGULAR SPACING IN A MEMORY ARRAY

(75) Inventors: Hidehiko Shiraiwa, San Jose, CA (US); Jean Yee-Mei Yang, Sunnyvale, CA (US); Jaeyong Park, Sunnyvale, CA (US); Cyrus E. Tabery, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/003,574

(22) Filed: Dec. 3, 2004

(51) Int. Cl.
*H01L 21/336* (2006.01)
*H01L 21/302* (2006.01)

(52) U.S. Cl. ...................... 438/262; 438/736

(58) Field of Classification Search ............... 438/142, 438/197, 213, 238, 262, 275, 279, 287, 689, 438/706, 709, 710, 917, 718, 733, 736, 740, 438/286, 735, 942, 947
See application file for complete search history.

(56) References Cited

U.S. PATENT DOCUMENTS

| | | | |
|---|---|---|---|
| 6,063,547 A * | 5/2000 | Ye et al. | 430/313 |
| 6,225,219 B1 * | 5/2001 | Lee et al. | 438/671 |
| 6,818,141 B1 * | 11/2004 | Plat et al. | 216/67 |

* cited by examiner

*Primary Examiner*—Brook Kebede
(74) *Attorney, Agent, or Firm*—Farjami & Farjami LLP (57) ABSTRACT

According to one exemplary embodiment, a method of fabricating memory array includes forming a number of hard mask lines and at least one dummy hard mask line on a layer of polysilicon, where the at least one dummy hard mask line is situated in a bitline contact region of the memory array. The method further includes removing the at least one dummy hard mask line. According to this embodiment, the method further includes forming a number of wordlines, where each of the wordlines is situated under one of the hard mask lines, and where the bitline contact region causes an irregularity in spacing of the wordlines. Two of the wordlines are situated adjacent to the bitline contact region such that the spacing between the two wordlines is substantially equal to a width of the bit line contact region.

18 Claims, 6 Drawing Sheets

METHOD FOR FORMING WORDLINES HAVING IRREGULAR SPACING IN A MEMORY ARRAY

TECHNICAL FIELD

The present invention is generally in the field of semiconductor devices. More particularly, the present invention is in the field of fabrication of memory arrays.

BACKGROUND ART

A typical memory array, such as a flash memory, includes rows of wordlines situated over that aligned perpendicular to columns of bitlines, which are formed in a substrate. Bitline contacts are formed between some of the wordlines to connect the bitlines to metal lines, which are formed in an interconnect metal layer situated above the wordlines. Since the spacing between wordlines that are situated adjacent to the bitline contacts is greater than the spacing between other wordlines, the bitline contacts cause an irregularity in wordline spacing in the memory array. During wordline fabrication, this irregularity in wordline spacing causes a difficulty in controlling the width of the wordlines situated adjacent to bitline contacts.

In a typical conventional wordline formation process, a hard mask layer is formed over a layer of polycrystalline silicon (polysilicon) and a layer of photoresist is patterned over the hard mask layer to form lines of photoresist. The layer of photoresist can be patterned in a photolithographic process using a mask. The width of the photoresist lines determines the width of subsequently formed wordlines, which are etched in the polysilicon layer. However, the width of the photoresist lines corresponding to wordlines situated adjacent to bitline contacts is difficult to control in the photolithographic process, and becomes increasingly more difficult to control as wordline width is scaled down.

In a conventional approach, a scattering bar can be used on the mask to increase the space between photoresist lines corresponding to wordlines situated adjacent to bit contacts and, thereby, assist in the photolithographic printing of those photoresist lines. However, if the scattering bar is not sufficiently narrower than the wordline, the scattering bar can be printed on the photoresist layer, which is undesirable. Thus, for the above reason, the scattering bar is not useable for printing photoresist lines for very narrow wordlines, such as wordlines having a width of 0.1 micron or less, having irregular spacing.

Thus, there is a need in the art for an effective method of forming wordlines having irregular spacing in a memory array, such as a flash memory array.

SUMMARY

The present invention is directed to method for forming wordlines having irregular spacing in a memory array. The present invention addresses and resolves the need in the art for an effective method of forming wordlines having irregular spacing in a memory array, such as a flash memory array.

According to one exemplary embodiment, a method of fabricating memory array includes forming a number of hard mask lines and at least one dummy hard mask line on a layer of polysilicon, where the at least one dummy hard mask line is situated in a bitline contact region of the memory array. The layer of polysilicon may be situated over an ONO stack, for example. The at least one dummy hard mask line may be two dummy hard mask lines, for example. The method further includes removing the at least one dummy hard mask line.

According to this embodiment, the method further includes forming a number of wordlines, where each of the wordlines is situated under one of the hard mask lines, and where the bitline contact region causes an irregularity in spacing of the wordlines. Two of the wordlines are situated adjacent to the bitline contact region such that the spacing between the two wordlines is substantially equal to a width of the bit line contact region. Other features and advantages of the present invention will become more readily apparent to those of ordinary skill in the art after reviewing the following detailed description and accompanying drawings.

DETAILED DESCRIPTION OF THE INVENTION

The present invention is directed to method for forming wordlines having irregular spacing in a memory array. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

Figure 1:
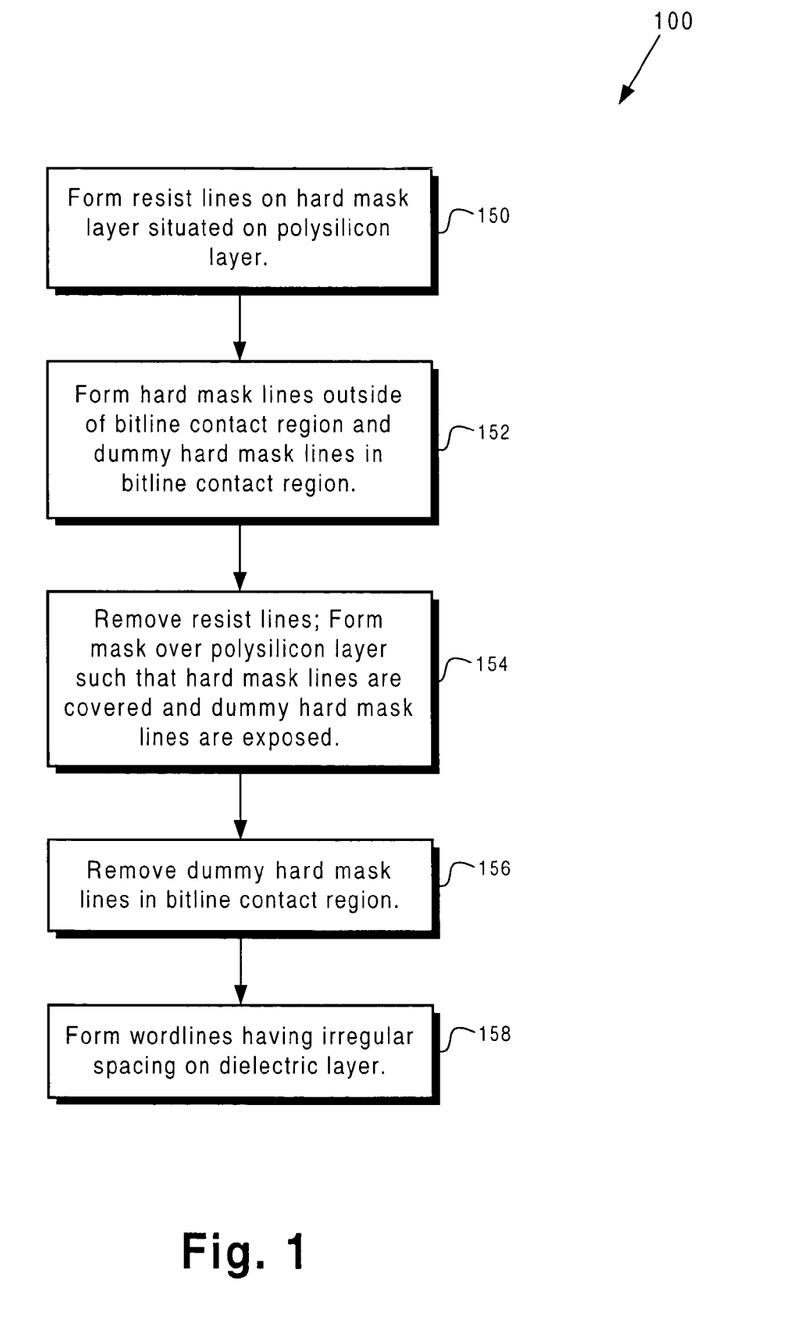
FIG. 1 is a flowchart corresponding to exemplary method steps according to one embodiment of the present invention.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment, as is known in the art. While steps 150 through 158 indicated in flowchart 100 are sufficient to describe one embodiment of the present invention, other embodiments of the invention may use steps different from those shown in flowchart 100. It is noted that the processing steps shown in flowchart 100 are performed on a wafer, which, prior to step 150, includes a hard mask layer situated on a layer of polysilicon, which is situated over a dielectric layer.

Referring to FIGS. 2A, 2B, 2C, 2D, and 2E, each of structures 250, 252, 254, 256, and 258 illustrates the result of performing steps 150, 152, 154, 156, and 158, respectively, of flowchart 100 of FIG. 1. For example, structure 250 shows the result of performing step 150, structure 252 shows the result of performing step 152, and so forth.

Figure 2A:
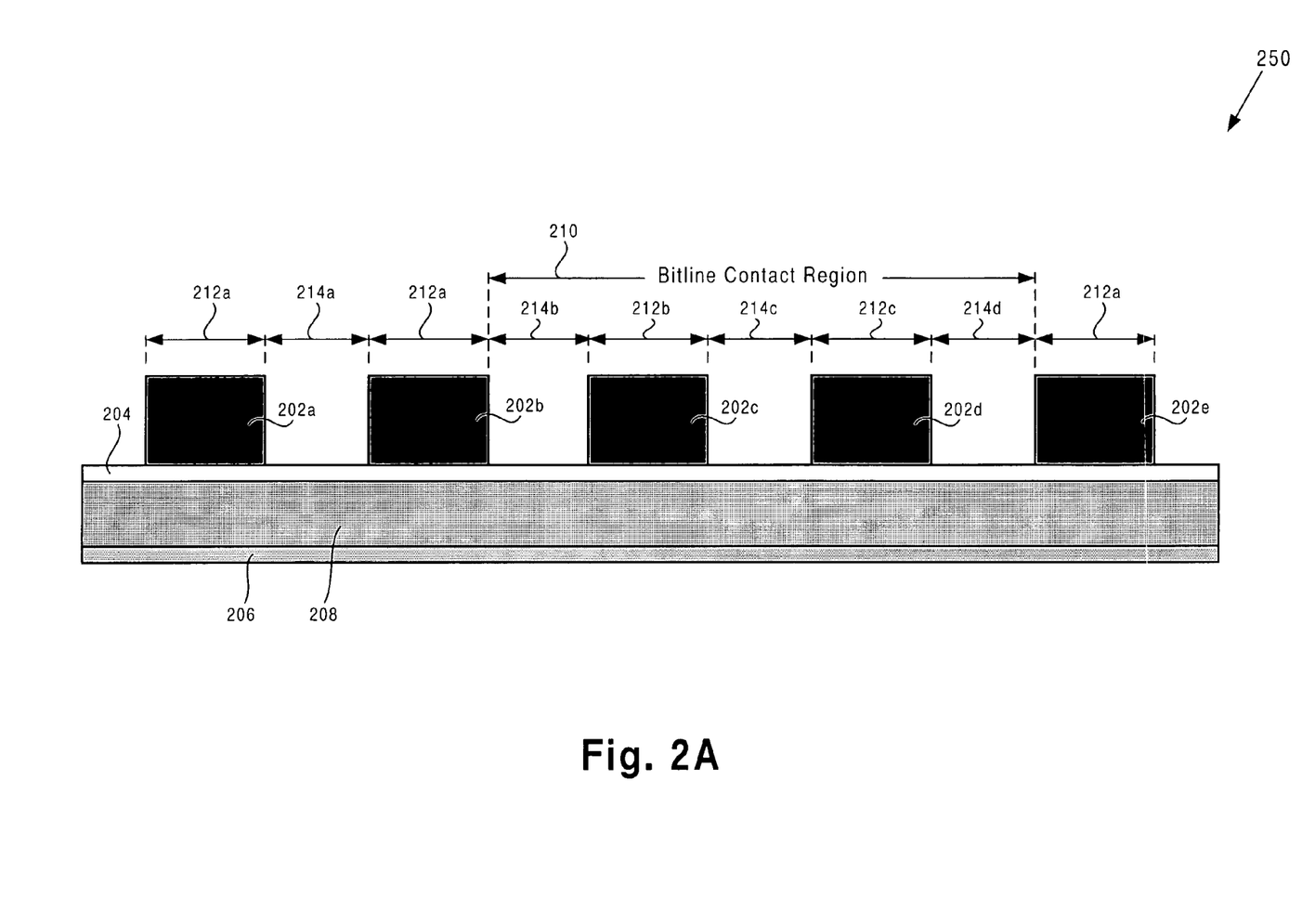
FIG. 2A illustrates a cross-sectional view, which includes portions of an exemplary structure fabricated according to an embodiment of the present invention and a corresponding process step of the flowchart of FIG. 1.

Reference is now made to step 150 in flowchart 100 of FIG. 1, and the resulting structure 250 in FIG. 2A. Structure 250 is a portion of a structure formed after resist lines 202a, 202b, 202c, 202d, and 202e have been formed on hard mask layer 204 at step 150, which occurs during fabrication of an exemplary memory array, such as a flash memory array, on a substrate (not shown in any of the figures). Structure 250 includes, among other things, dielectric layer 206, which can be a gate oxide layer comprising silicon oxide. The gate oxide layer can be formed on a substrate by a chemical vapor deposition (CVD) process or other appropriate deposition process or can be thermally grown. In one embodiment, dielectric layer 206 can comprise an ONO (Oxide-Nitride-Oxide) stack, which includes a layer of silicon nitride situated between two layers of silicon oxide. The ONO stack can be formed by sequentially deposited a layer of silicon oxide, a layer of silicon nitride, and another layer of silicon oxide over a substrate using a CVD process or other appropriate processes.

Structure 250 also includes polysilicon layer 208, which is situated on dielectric layer 206. Polysilicon layer 208 comprises polysilicon and can be formed by depositing a layer of polysilicon on dielectric layer 206 using a CVD process or other appropriate processes. Structure 250 further includes hard mask layer 204, which is situated on polysilicon layer 208. Hard mask layer 204 can comprise silicon oxide, silicon nitride, silicon oxynitride, or other appropriate hard mask material and can be formed by using a CVD process or other appropriate processes.

As stated above, at step 150, resist lines 202a, 202b, 202c, 202d, and 202e are formed on hard mask layer 204, which is situated on polysilicon layer 208. Resist lines 202a, 202b, 202c, 202d, and 202e can be formed by depositing, patterning, and etching a layer of resist, such as a layer of photoresist or other appropriate resist material, in a manner known in the art. Resist lines 202c and 202d are situated in bitline contact region 210, which extends between resist lines 202b and 202e. Bitline contact region 210 is a region of the memory array in which contacts will be formed between bitlines (not shown in FIG. 2A), which are formed in a substrate under dielectric layer 206, and metal lines (not shown in FIG. 2A), which will be formed in an interconnect metal layer (not shown in FIG. 2A).

As shown in FIG. 2A, resist lines 202a, 202b, and 202e have width 212a, resist line 202c has width 212b, and resist line 202d has width 212c. In the present embodiment, widths 212a, 212b, and 212c are equal, i.e. resist lines 202a, 202b, 202c, 202d, and 202e have the same width. By way of example, widths 212a, 212b, and 212c can be between approximately 70.0 nanometers (nm) and approximately 80.0 nm. In other embodiments, widths 212a, 212b, and 212c may be greater than 80.0 nm or less than 70.0 nm. In one embodiment, widths 212b and 212c can be equal to width 212a plus or minus approximately 10.0 percent. In such embodiment, widths 212b and 212c can be varied to adjust the spacing between resist lines 202b and 202e, which determines the width of bitline contact region 210.

In one embodiment, one wide resist line can be formed in bitline contact region 210 in place of resist lines 202c and 202d. In such embodiment, the width of the wide resist line in bitline contact region 210 can be varied to adjust the spacing between resist lines 202b and 202e. Also shown in FIG. 2A, distance 214a separates resist lines 202a and 202b, distance 214b separates resist lines 202b and 202c, distance 214c separates resist lines 202c and 202d, and distance 214d separates resist lines 202d and 202e. In the present embodiment, distances 214a, 214b, 214c and 214d are equal, i.e. adjacent resist lines have the same spacing. Thus, resist lines 202a, 202b, 202c, 202d, and 202e have regular spacing, i.e. they are evenly spaced. Since resist lines 202a, 202b, 202c, 202d, and 202e have regular spacing, they can be formed with minimal difficulty at a desirably thin width. Furthermore, in the present invention, resist lines 202a, 202b, 202c, 202d, and 202e can be formed at a desirably thin width, such as a width of between approximately 70.0 nm and approximately 80.0 nm, without requiring a scattering bar.

By way of example, distances 214a, 214b, 214c, and 214d can be between approximately 70.0 nm and approximately 80.0 nm. In other embodiments, distances 214a, 214b, 214c, and 214d may be greater than 80.0 nm or less than 70.0 nm. In one embodiment, distances 214b, 214c, and 214d can be equal to distance 214a plus or minus approximately 10.0 percent. In such embodiment, distances 214b, 214c, and 214d may be varied to adjust the spacing between resist lines 202b and 202e. Resist lines 202a, 202b, and 202e determine the width and spacing of subsequently formed wordlines. It is noted that although only resist lines 202a, 202b, 202c, 202d, and 202e and bitline contact region 210 are described in detail herein to preserve brevity, structure 250 can include a large number of resist lines and a large number of bitline contact regions.

Figure 2B:
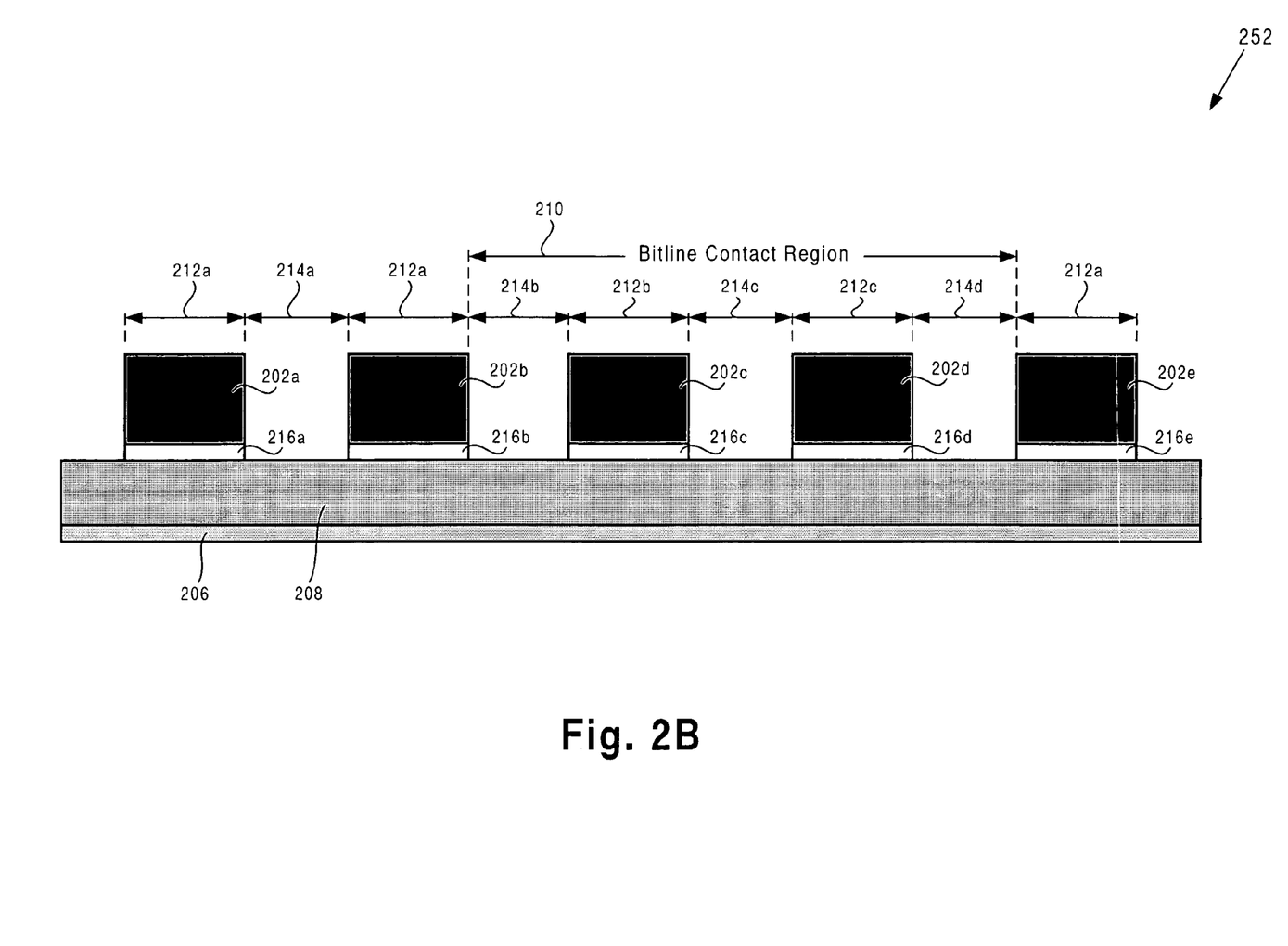
FIG. 2B illustrates a cross-sectional view, which includes portions of an exemplary structure fabricated according to an embodiment of the present invention and a corresponding process step of the flowchart of FIG. 1.

Referring to step 152 in FIG. 1 and structure 252 in FIG. 2B, at step 152 of flowchart 100, hard mask lines 216a, 216b, and 216e are formed outside of bitline contact region 210 and dummy hard mask lines 216c and 216d are formed in bitline contact region 210. Hard mask lines 216a, 216b, and 216e and dummy hard mask lines 216c and 216d can be formed on polysilicon layer 208 by etching hard mask layer 204 using an appropriate etch process, such as a dry etch process. During the etch process, resist lines 202a, 202b, and 202e are used as masks to form respective hard mask lines 216a, 216b, and 216e, while resist lines 202c and 202d are used as masks to form respective dummy hard mask lines 216c and 216d. Thus, resist lines 202a, 202b, and 202e determine the width and spacing of respective hard mask lines 216a, 216b, and 216e, while resist lines 202c and 202d determine the width and spacing of dummy hard mask lines 216c and 216d.

Hard mask lines 216a, 216b, and 216e, which are situated outside of bitline contact region 210, are used to form wordlines in a subsequent process step. However, dummy hard mask lines 216c and 216d, which are situated in bitline contact region 210, are not used to form wordlines, since they (i.e. dummy hard mask lines 216c and 216d) are removed in an etch step prior to the formation of wordines. Dummy hard mask lines 216c and 216d are used to determine the spacing between hard mask lines 216b and 216e, which are used in a subsequent etch step to form wordlines situated adjacent to bitline contact region 210. Thus, dummy hard mask lines 216c and 216d can be used to determine the spacing between subsequently formed wordlines situated adjacent to bitline contact region 210.

In one embodiment, only one wide resist line is formed in bitline contact region 210 and, consequently, only one dummy hard mask line is formed in bitline contact region 210. In such embodiment, the single dummy hard mask line formed in bitline contact region 210 has a width that is much wider than dummy hard mask lines 216c and 216d. The width of the single dummy hard mask line can be used to adjust the spacing between hard mask lines 216b and 216e situated adjacent to bitline contact region 210.

Figure 2C:
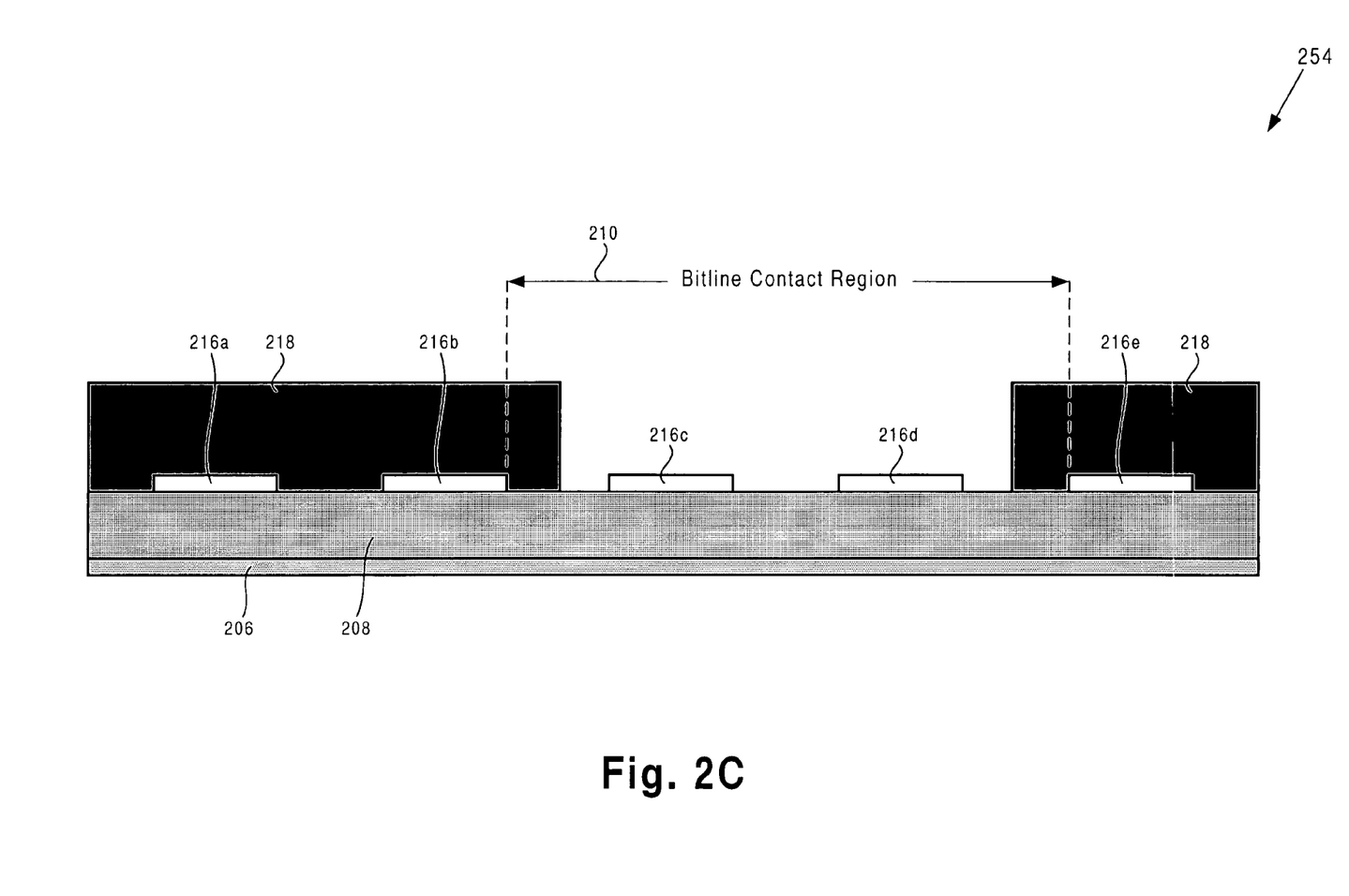
FIG. 2C illustrates a cross-sectional view, which includes portions of an exemplary structure fabricated according to an embodiment of the present invention and a corresponding process step of the flowchart of FIG. 1.

Referring to step 154 in FIG. 1 and structure 254 in FIG. 2C, at step 154 of flowchart 100, resist lines 202a, 202b, 202c, 202d, and 202e are removed and mask 218 is formed over polysilicon layer 208 such hard mask lines 216a, 216b, and 216e are covered while dummy hard mask lines 216c and 216d are exposed. Resist lines 202a, 202b, 202c, 202d, and 202e can be removed in a wet etch process utilizing an appropriate solvent. Mask 218 covers hard mask lines 216a, 216b, and 216e, which are situated outside of bitline contact region 210 and exposes dummy hard mask lines 216c and 216d, which are situated in bitline contact region 210. Mask 218 can be formed by depositing, patterning, and etching a layer of resist, such as a layer of photoresist or other appropriate resist material, in a manner known in the art.

Figure 2D:
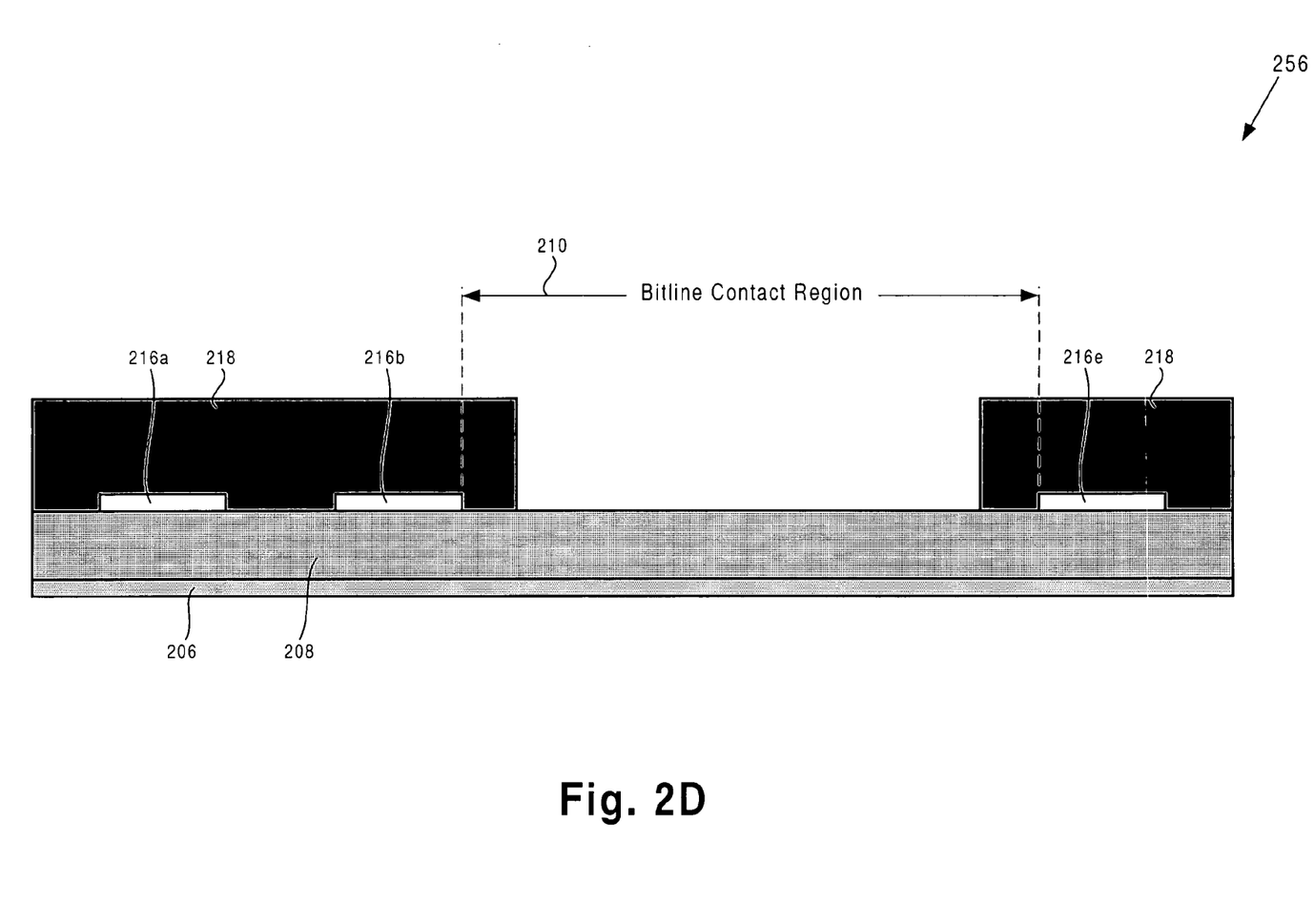
FIG. 2D illustrates a cross-sectional view, which includes portions of an exemplary structure fabricated according to an embodiment of the present invention and a corresponding process step of the flowchart of FIG. 1.

Referring to step 156 in FIG. 1 and structure 256 in FIG. 2D, at step 156 of flowchart 100, dummy hard mask lines 216c and 216d in bitline contact region 210 are removed. Dummy hard mask lines 216c and 216d can be remove in an appropriate etch process as is known in the art. Hard mask lines 216a, 216b, and 216e, which are protected by mask 218 during the etch process used to remove dummy hard mask lines 216c and 216d, will be used in a subsequent wordline formation step.

Figure 2E:
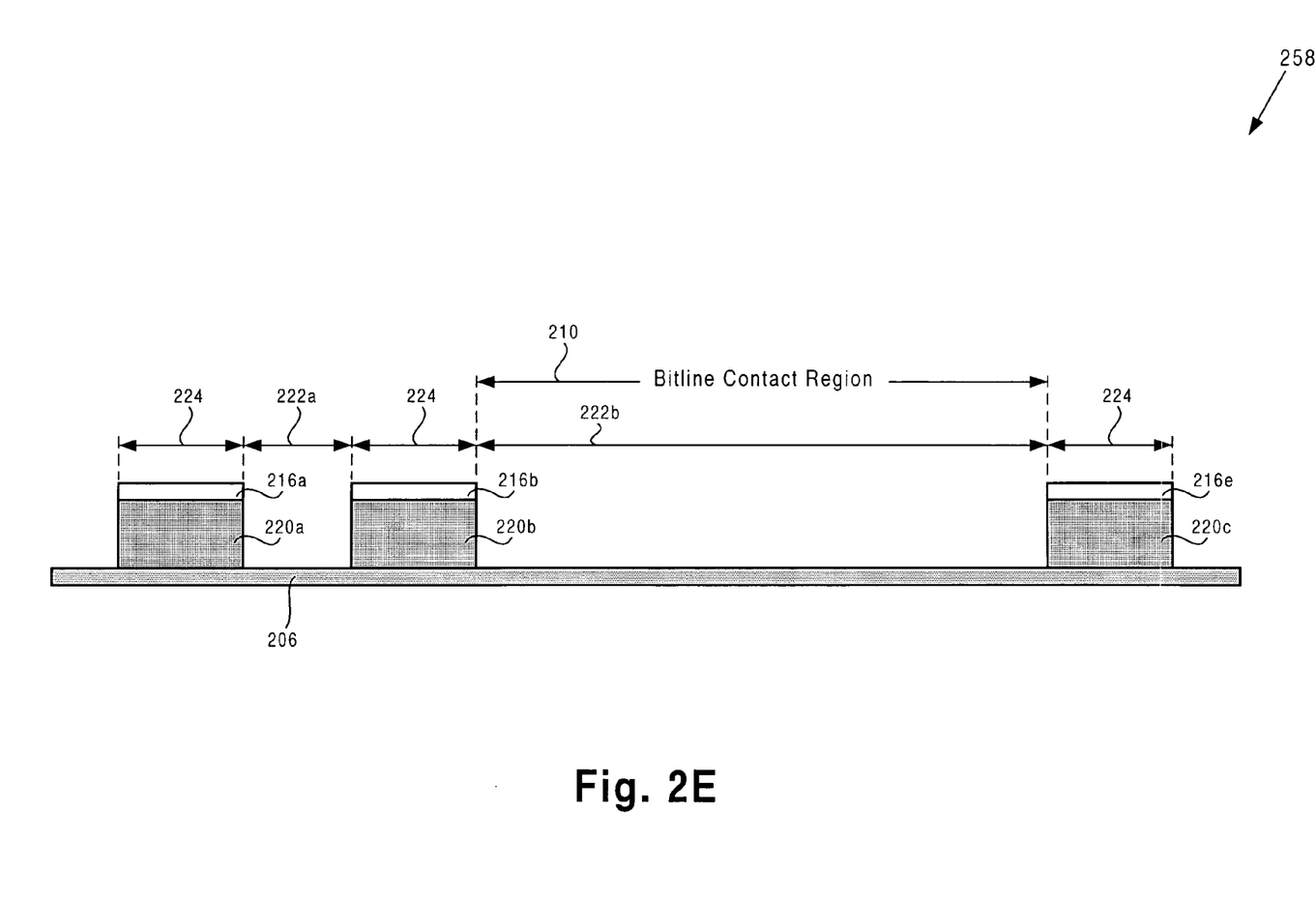
FIG. 2E illustrates a cross-sectional view, which includes portions of an exemplary structure fabricated according to an embodiment of the present invention and a corresponding process step of the flowchart of FIG. 1.

Referring to step 158 in FIG. 1 and structure 258 in FIG. 2E, at step 158 of flowchart 100, wordlines 220a, 220b, and 220c are formed on dielectric layer 206, where wordlines 220a, 220b, and 220c have irregular spacing. Wordlines 220a, 220b, and 220c are situated under respective hard mask lines 216a, 216b, and 216e, comprise polysilicon, and can be formed by using a dry etch process to etch polysilicon layer 208 (shown in FIGS. 2A, 2B, 2C, and 2D). During the dry etch process, hard mask lines 216a, 216b, and 216e function as masks to form respective wordlines 220a, 220b, and 220c.

As shown in FIG. 2E, wordlines 216a and 216b are separated by space 222a, which is substantially equal to space 214a in FIG. 2A. As also shown in FIG. 2E, wordlines 220b and 220c, which are situated adjacent to bitline contact region 210, are separated by distance 222b, which is substantially equal to the width of bitline contact region 210. Wordlines 220a, 220b, and 220c have width 224, which is substantially equal to width 212a of resist lines 102a, 102b, and 102e in FIG. 2A. Thus, as a result of bitline contact region 210, wordlines 220a, 220b, and 220c have irregular spacing. However, as discussed above, since resist lines 202a, 202b, 202c, 202d, and 202e have even spacing, they can be effectively formed having a desirably thin width. Thus, since resist lines 202a, 202b, and 202e determine the width of respective wordlines 220a, 220b, and 220c, wordlines 220a, 220b, and 220c can also be effectively formed having a desirably thin width.

Thus, as discussed above, the present invention advantageously achieves a method for effectively forming wordlines having a desirably thin width, including wordline that are situated adjacent to a bitline contact region in a memory array. Thus, the present invention advantageously achieves a method for effectively forming wordlines having a desirably thin width, where the wordlines have irregular spacing in the memory array.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for forming wordlines having irregular spacing in a memory array has been described.

The invention claimed is:

1. A method of fabricating a memory array, said method comprising:
   forming a plurality of hard mask lines and at least one dummy hard mask line on a layer of polysilicon, said at least one dummy hard mask line being situated in a bitline contact region of said memory array;
   forming a mask over said layer of polysilicon, wherein said mask covers said plurality of hard mask lines and does not cover said at least one dummy hard mask line;
   removing said at least one dummy hard mask line;
   forming a plurality of wordlines, each of said plurality of wordlines being situated under one of said plurality of hard mask lines;
   said method thereby controlling a spacing of said plurality of wordlines in said bitline contact region.

2. The method of claim 1 further comprising a step of forming a first plurality of resist lines on a hard mask layer prior to said step of forming said plurality of hard mask lines, wherein at least one of said first plurality of resist lines is situated in said bitline contact region.

3. The method of claim 2 wherein said first plurality of resist lines are evenly spaced.

4. The method of claim 1 wherein said at least one dummy hard mask line comprises two dummy hard mask lines.

5. The method of claim 2 wherein said at least one resist line comprises two resist lines.

6. The method of claim 1 wherein two of said plurality of wordlines are situated adjacent to said bitline contact region, where a distance between said two of said plurality of wordlines is substantially equal to a width of said bit line contact region.

7. The method of claim 2 wherein a width of each of said first plurality of resist lines is between approximately 70.0 nanometers and approximately 80.0 nanometers.

8. The method of claim 2 wherein said first plurality of resist lines comprises a second plurality of resist lines, wherein each of said second plurality of resist lines determines a width of one of said plurality of hard mask lines.

9. The method of claim 1 wherein said layer of polysilicon is situated over an ONO stack.

10. A method of fabricating a memory array, said method comprising:
    forming a first plurality of resist lines on a hard mask layer situated on a layer of polysilicon, at least one of said first plurality of resist lines being situated in a bitline contact region of said memory array;

forming a plurality of hard mask lines and at least one dummy hard mask line on said layer of polysilicon, said at least one dummy hard mask line being situated in said bitline contact region;

forming a mask over said layer of polysilicon, wherein said mask covers said plurality of hard mask lines and does not cover said at least one dummy hard mask line;

removing said at least one dummy hard mask line;

forming a plurality of wordlines, each of said plurality of wordlines being situated under one of said plurality of hard mask lines;

said method thereby controlling a spacing of said plurality of wordlines in said bitline contact region.

11. The method of claim 10 wherein said first plurality of resist lines are evenly spaced.

12. The method of claim 10 wherein said at least one dummy hard mask line comprises two dummy hard mask lines.

13. The method of claim 10 wherein said at least one resist line comprises two resist lines.

14. The method of claim 10 wherein said first plurality of resist lines comprises a second plurality of resist lines, wherein each of said second plurality of resist lines is situated outside of said bitline contact region, wherein said at least one resist line has a width greater than a width of each of said second plurality of resist lines.

15. The method of claim 10 wherein said first plurality of resist lines comprises a second plurality of resist lines, wherein each of said second plurality of resist lines determines a width of one of said plurality of hard mask lines.

16. The method of claim 10 wherein a distance between two of said wordlines is substantially equal to a width of said bit line contact region.

17. The method of claim 10 wherein a width of each of said first plurality of resist lines is between approximately 70.0 nanometers and approximately 80.0 nanometers.

18. The method of claim 10 wherein said layer of polysilicon is situated over an ONO stack.

* * * * *

UNITED STATES PATENT AND TRADEMARK OFFICE
CERTIFICATE OF CORRECTION

| | | |
|---|---|---|
| PATENT NO. | : 7,052,961 B1 | Page 1 of 1 |
| APPLICATION NO. | : 11/003574 | |
| DATED | : May 30, 2006 | |
| INVENTOR(S) | : Shiraiwa et al. | |

It is certified that error appears in the above-identified patent and that said Letters Patent is hereby corrected as shown below:

On the title page, field (73) the "Assignee: Spansion LLC, Sunnyvale, CA (US)"

should be --Assignees: Spansion LLC, Sunnyvale, CA (US); Advanced Micro Devices, Inc., Sunnyvale, CA (US)--.

Signed and Sealed this

Twenty-fourth Day of April, 2007

JON W. DUDAS
*Director of the United States Patent and Trademark Office*

UNITED STATES PATENT AND TRADEMARK OFFICE
CERTIFICATE OF CORRECTION

PATENT NO. : 7,052,961 B1
APPLICATION NO. : 11/003574
DATED : May 30, 2006
INVENTOR(S) : Shiraiwa et al.

Page 1 of 1

It is certified that error appears in the above-identified patent and that said Letters Patent is hereby corrected as shown below:

On the title page, field (73) the "Assignee: Spansion LLC, Sunnyvale, CA (US)" should be --Assignees: Spansion LLC, Sunnyvale, CA (US); Advanced Micro Devices, Inc., Sunnyvale, CA (US)--.

Signed and Sealed this

Twenty-second Day of May, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,052,961 B1 |
| APPLICATION NO. | : 11/003574 |
| DATED | : May 30, 2006 |
| INVENTOR(S) | : Shiraiwa et al. |

It is certified that error appears in the above-identified patent and that said Letters Patent is hereby corrected as shown below:

On the title page, field (73) the "Assignee: Spansion LLC, Sunnyvale, CA (US)" should be --Assignees: Spansion LLC, Sunnyvale, CA (US); Advanced Micro Devices, Inc., Sunnyvale, CA (US)--.

Signed and Sealed this

Fifth Day of June, 2007

JON W. DUDAS
*Director of the United States Patent and Trademark Office*